United States Patent [19]

Yamada et al.

[11] Patent Number: 5,406,636
[45] Date of Patent: Apr. 11, 1995

[54] SIGNAL PROCESSING DEVICE

[75] Inventors: Yusuki Yamada; Hidemitsu Nakano, both of Itami, Japan

[73] Assignees: Mitsubishi Denki Kabushiki Kaisha; Mitsubishi Electric Engineering Company Limited, both of Tokyo, Japan

[21] Appl. No.: 48,515

[22] Filed: Apr. 20, 1993

[30] Foreign Application Priority Data

May 7, 1992 [JP] Japan ................................. 4-114706

[51] Int. Cl.$^6$ .............................................. H03G 7/00
[52] U.S. Cl. ................................... 381/106; 381/104
[58] Field of Search ........................ 381/106, 104, 94; 307/570; 257/379; 330/257, 253

[56] References Cited

U.S. PATENT DOCUMENTS

| | | | |
|---|---|---|---|
| 4,126,830 | 11/1978 | Schade, Jr. | 330/253 |
| 4,991,221 | 2/1991 | Rush | 381/120 |
| 5,201,009 | 4/1993 | Yamada et al. | |
| 5,237,195 | 8/1993 | Sadamatsu | 257/379 |

*Primary Examiner*—Curtis Kuntz
*Assistant Examiner*—Ping W. Lee
*Attorney, Agent, or Firm*—Oblon, Spivak, McClelland, Maier & Neustadt

[57] ABSTRACT

An audio electronic volume controller (100; consisting of a ladder resistance and a CMOS switch group) and an output buffer (B2) are formed within an identical semiconductor substrate 10S, and nodes ($N_{31}$ and $N_{31}$) are directly connected by a wiring layer (31). An input differential circuit element of an operational amplifying element which is a main unit of the output buffer (B2) is configured using MOSFETs. Accordingly, input bias current and floating impedance can be decreased which leads to a decrease in the generation of click noise.

9 Claims, 11 Drawing Sheets

SIGNAL PROCESSING DEVICE

BACKGROUND OF THE INVENTION

1. Field of the Invention

The present invention relates to a signal processing device having functions such as varying a level of an audio signal.

2. Description of the Prior Art

FIG. 11 is a circuit diagram showing a prior art audio signal processing apparatus SPAO. The signal processing apparatus SPAO is comprised of discrete ICs and passive elements; that is, the signal processing apparatus SPAO generally consists of an input buffer B1, an output buffer B2P, an electronic volume circuit 100P, and a differentiating circuit. The differentiating circuit consists of a capacitor 22 and a resistance 15.

The electronic volume circuit 100P is a digital IC consisting of a ladder resistance 4P and an analog switch group 3P; the ladder resistance 4P has n resistances, $R_1$ to $R_n$, and the analog switch group 3P has n analog switches, $S_1$ to $S_n$.

When the above-mentioned electronic volume circuit 100P is used in an audio circuit, the analog switch group 3P is comprised of elements each having a CMOS structure, namely, so-called transmission gates. FIG. 4(b) depicts a symbolized transmission gate circuit with a symbolized switch SW (FIG. 4(a)). The switch SW of FIG. 4(a) is equivalent to each of the analog switches, $S_1$ to $S_n$, shown in FIG. 11. FIG. 5 depicts a control circuit of the transmission gate, and FIG. 6 depicts its internal equivalent circuit. Either of the circuits is a well-known basic circuit.

In general, several tens of the electronic volume circuits 100P each consisting of the transmission gate SW group 3P and the ladder resistance 4P are connected in series, and each of the switches arbitrarily turns ON/OFF, thereby each electronic volume circuit 100P functions as a variable resistance. The switch group 3P is fabricated according to a system design where a digital signal control by a micro computer or the like allows the switches, $S_1$ to $S_n$, to operate. Specifically, the so-called up-down switches work like a manual type mechanical volume to sequentially raise or drop an attenuation level.

On the other hand, the input buffer B1 is comprised of an operational amplifier 1, a capacitor 21 and a resistance 11. The capacitor 21 performs a.c. coupling. The operational amplifier 1 buffers an input signal $V_1$ to the electronic volume circuit 100P without attenuation caused by impedance mismatching. D.C. bias voltage $V_{cc}/2$ is applied via the resistance 11 to a positive (+) input terminal of the operational amplifier 1. The d.c. bias voltage $V_{cc}/2$ is produced by a bias circuit BiP. For example, voltage dividing resistances 130 and 140 are placed between supply voltage $V_{cc}$ and the ground GND so that the d.c. bias voltage $V_{cc}/2$ is produced. An electrolytic capacitor 24 permits the flow of alternating current from a junction at $V_{cc}/2$ (a node between the resistances 130 and 140) to ground it.

The output buffer B2P is comprised of an operational amplifier 20 and a resistance 120. The operational amplifier 20 buffers an output signal $V_3$ (signal at a node $N_{30}$) from the electronic volume circuit 100P to an output terminal $N_4$ without attenuation so that an output signal $V_4$ can be produced, not being affected by input impedance of a subsequent stage circuit connected to the output terminal $N_4$. Similarly, the d.c. bias voltage $V_{cc}/2$ is applied to a positive (+) input terminal of the operational amplifier 20.

The operational amplifiers 1 and 20 are analog ICs having a bipolar configuration.

Various disadvantages arise because of the above-mentioned configuration in the prior art signal processing apparatus.

FIG. 12 is a circuit diagram illustrating in detail an internal structure of the operational amplifier 20 shown in FIG. 11. As can be seen, a differential circuit equivalent to an input unit of the operational amplifier 20 is comprised of bipolar transistors $Q_1$ and $Q_2$. A resistance $R_B$ is represented as a variable resistance in an aspect that a resistance value at the ladder resistance 4 varies.

However, since the differential circuit of the input unit is comprised of the bipolar transistors $Q_1$ and $Q_2$, base current $I_B$ flows from its positive (+) input terminal to the variable resistance $R_B$ to cause voltage drop represented by $I_B \cdot R_B$. A signal $V_3$ (voltage drop $I_B \cdot R_n$) varies according to time-varying value of the resistance $R_B$ as the analog switch group 3P sequentially operate. Variations in the signal $V_3$ is shown in FIG. 13(a).

A waveform representing d.c. change in the signal $V_3$ is shaped as shown in FIG. 13(b) by a differentiating circuit consisting of a capacitor 22 and a resistance 15. In addition to that, a resistance and a capacitor in a subsequent stage circuit like a power amplifier are arranged to constitute an integrating circuit 50 as shown in FIG. 7. As a result, a waveform of an output signal $V_4$ ($V_{out}$) is smoothed by the integrating circuit 50, and an output signal $V_{INT}$ therefrom is a cause of noise (click noise) offending the ear.

The prior art signal processing apparatus is configured in such an arrangement that two discrete elements, namely, the electronic volume circuit 100P and the operational amplifier 20, are wired, and hence, floating impedance $Z_{ST}$ appears between those elements (100P and 20) (see FIG. 12). Since the base current $I_B$ also flows in the floating impedance $Z_{ST}$, variations in the output signal $V_3$ are further complicated. Thus, the floating impedance $Z_{ST}$ is also a cause of the generation of the click noise.

Disadvantages as mentioned above arise not merely in the signal processing apparatus SPAO but are generally caused in using electronic volume ICs.

SUMMARY OF THE INVENTION

According to the present invention, a signal processing device comprises (a) a semiconductor substrate; (b) a first input portion formed in the semiconductor substrate for receiving an analog input signal; (c) a second input portion formed in the semiconductor substrate for receiving a digital control signal; (d) first circuit means formed in the semiconductor substrate and connected to the first and second input portions, for varying a level of the analog input signal as a function of the digital control signal to produce a varied analog signal at its output terminal; and (e) second circuit means formed in the semiconductor substrate and connected to the output terminal of the first circuit means (d) for buffering the analog signal; the second circuit means (e) comprising (e-1) an operational amplifying element having its first input terminal connected to the output terminal of the first circuit means (d) and its second input terminal connected to its own output terminal, for operating depending upon a voltage level of the varied analog signal.

According to the present invention, no current is caused flow from the operational amplifying element (e-1) to the output terminal of the first circuit means (d). Moreover, connection of the output terminal of the first circuit means (d) to the input terminal of the operational amplifying element (e-1) inhibits the generation of the floating impedance.

Accordingly, it is an object of the present invention to provide a signal processing device which employs an electronic volume controller which prevents click noise to arise.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

A. Embodiment 1

Figure 1:
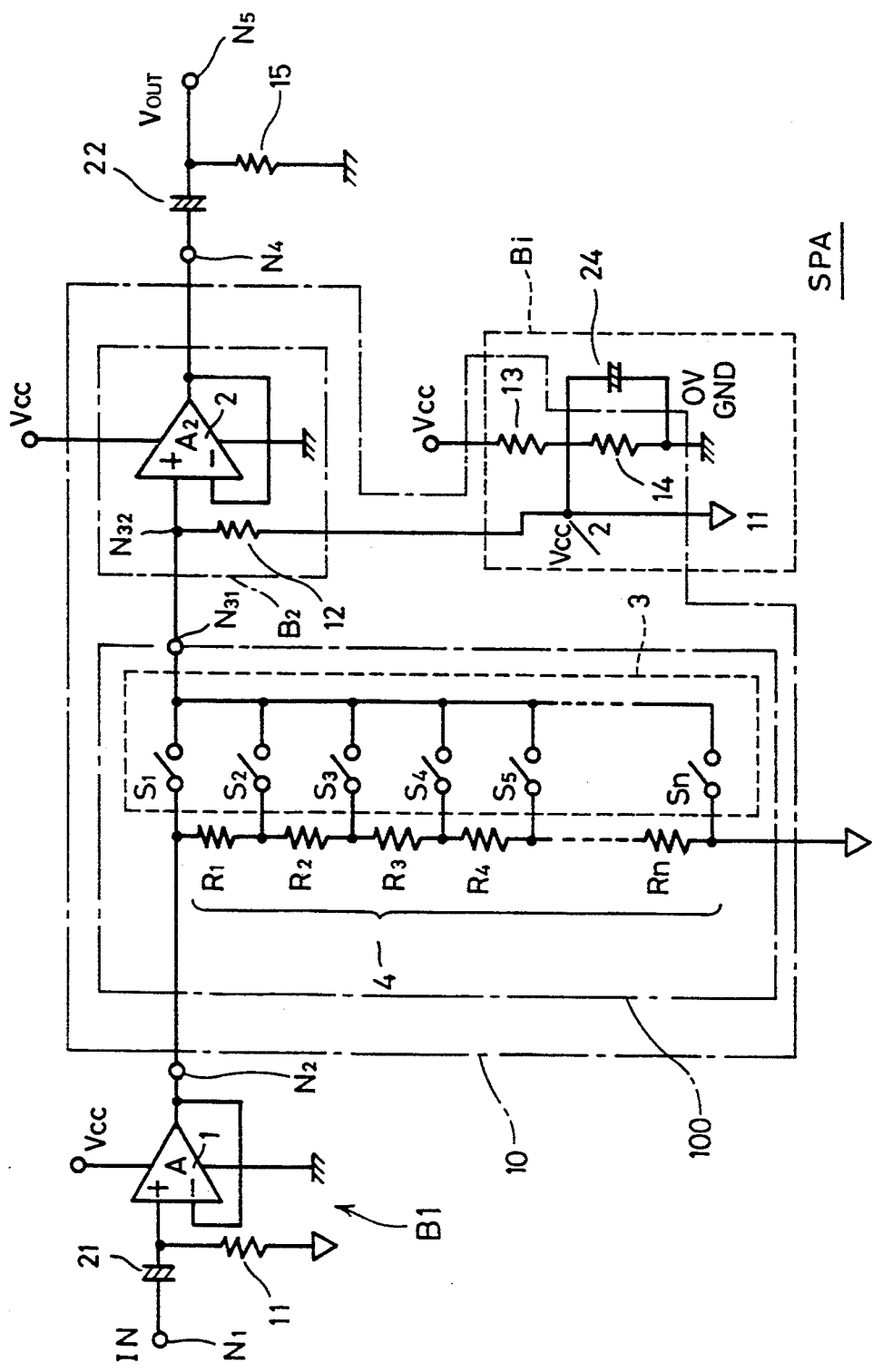
FIG. 1 depicts an electrical arrangement of a signal processing device of a first preferred embodiment according to the present invention.

FIG. 1 is a schematic circuit diagram showing an electrical arrangement of a signal processing device SPA of a preferred embodiment according to the present invention. The signal processing device SPA is generally comprised of an input buffer B1, a signal processing IC 10, and a differentiating circuit (consisting of a capacitor 22 and a resistance 15).

The input buffer B1 consists of an operational amplifier 1, a capacitor 21, and a resistance 11. The capacitor 21 is utilized herein to perform d.c. coupling. The operational amplifier 1 buffers an input signal $V_1$ to the signal processing circuit IC 10 without attenuation caused by impedance mismatching. D.C. bias voltage $V_{cc}/2$ is applied via the resistance 11 to a positive (+) input terminal of the operational amplifier 1. The d.c. bias voltage $V_{cc}/2$ is produced by a biasing element Bi as mentioned later.

The signal processing IC 10 is an integrated circuit which includes an electronic volume controller 100, an output buffer B2 and the biasing element Bi (except for an electrolytic capacitor 24) formed in an identical semiconductor chip. The electronic volume controller 100 functions as a digital IC, consisting of a ladder resistance part 4 and an analog switch group 3. The ladder resistance part 4 includes n resistance elements $R_1$ to $R_n$, and the analog switch group 3 includes n analog switch elements $S_1$ to $S_n$.

Figure 4:
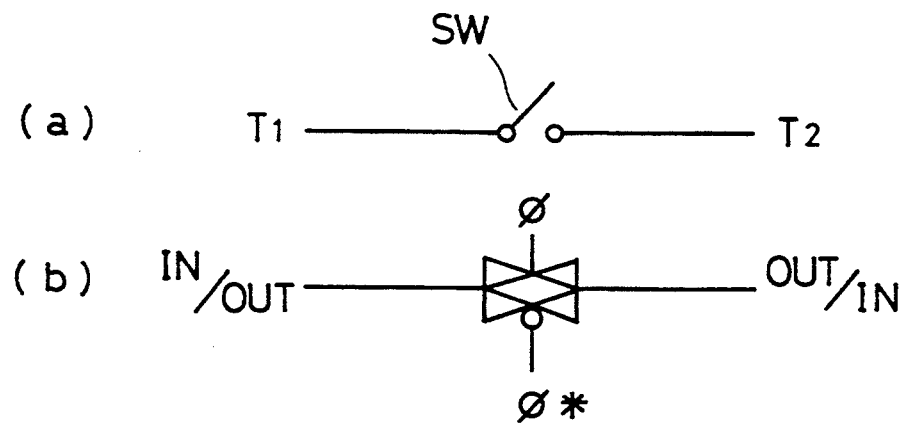
FIG. 4 illustrates symbols which represent an analog switch element.
Figure 5:
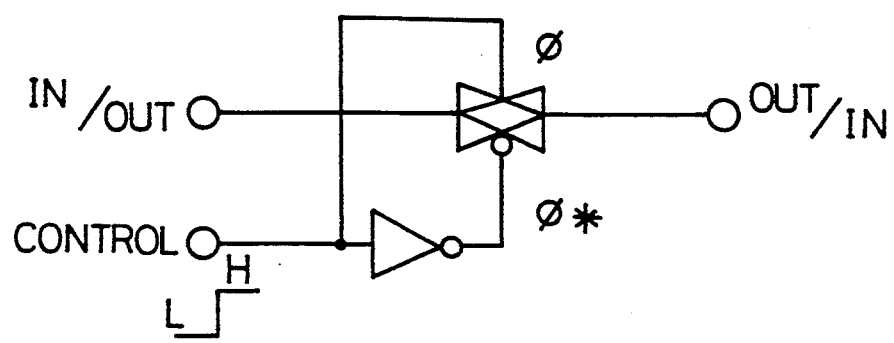
FIG. 5 is a diagram illustrating control of the analog switch elements.
Figure 6:
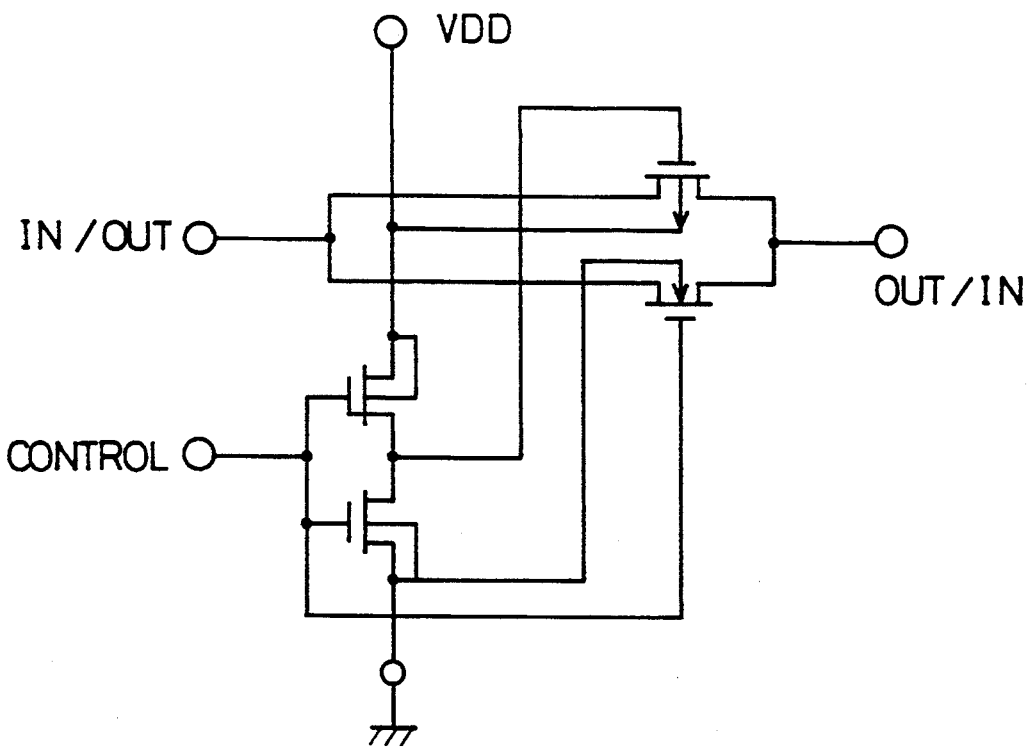
FIG. 6 is a circuit diagram showing in detail a structure of the analog switch element.
Figure 11:
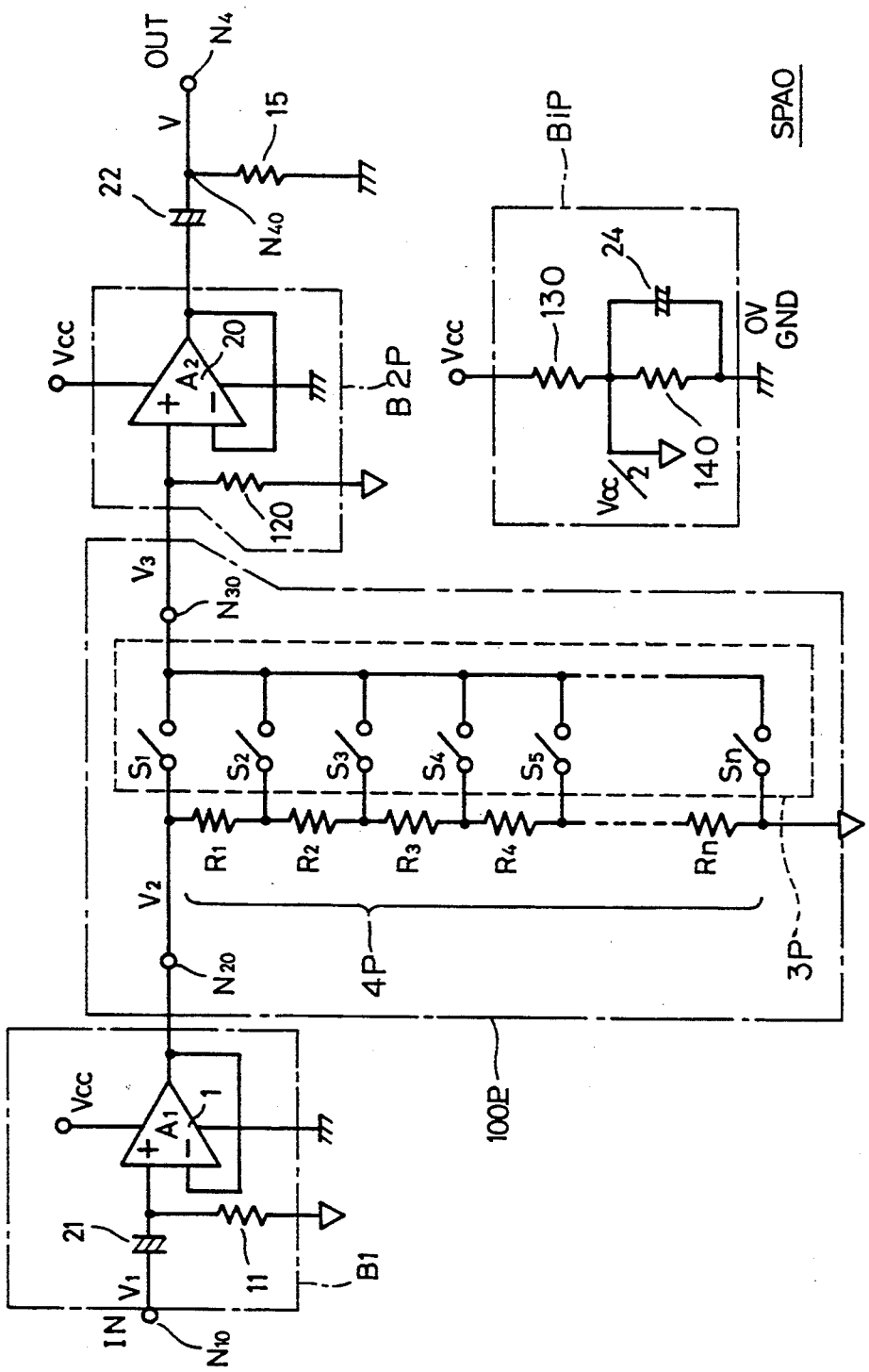
FIGS. 11, 12 and 13 depict 4 prior art embodiment.
Figure 12:
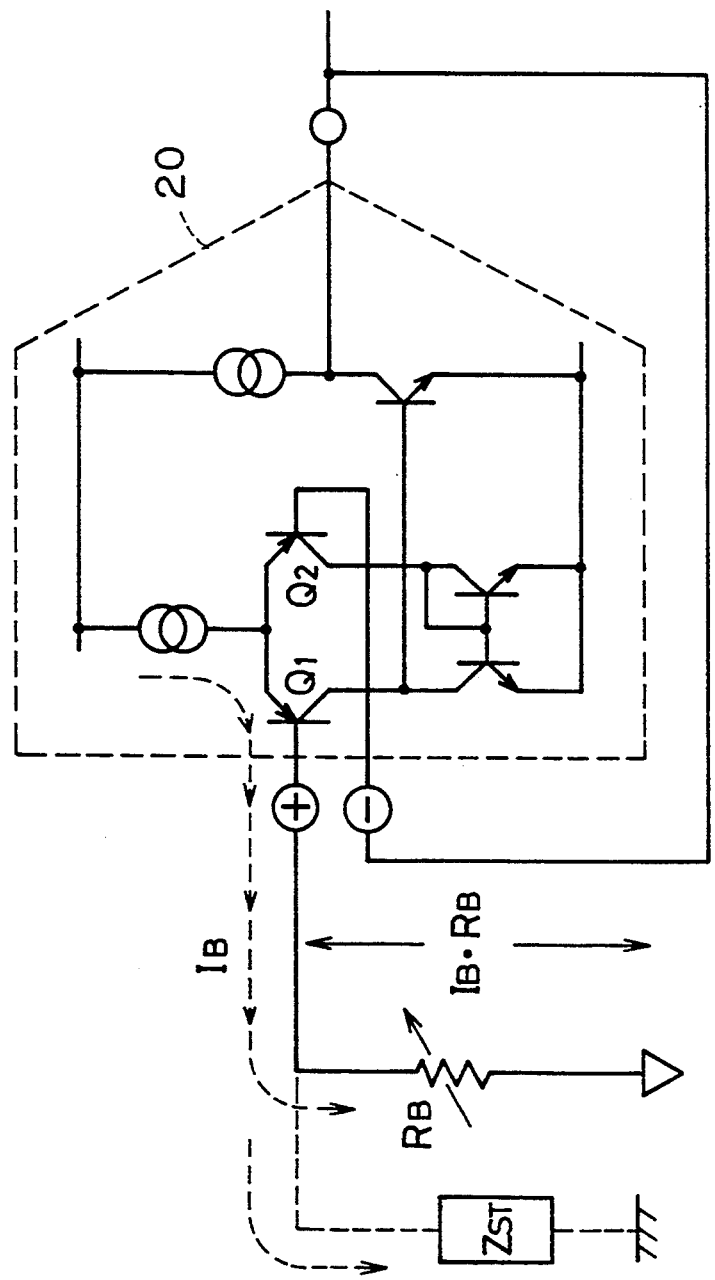
Figure 13:
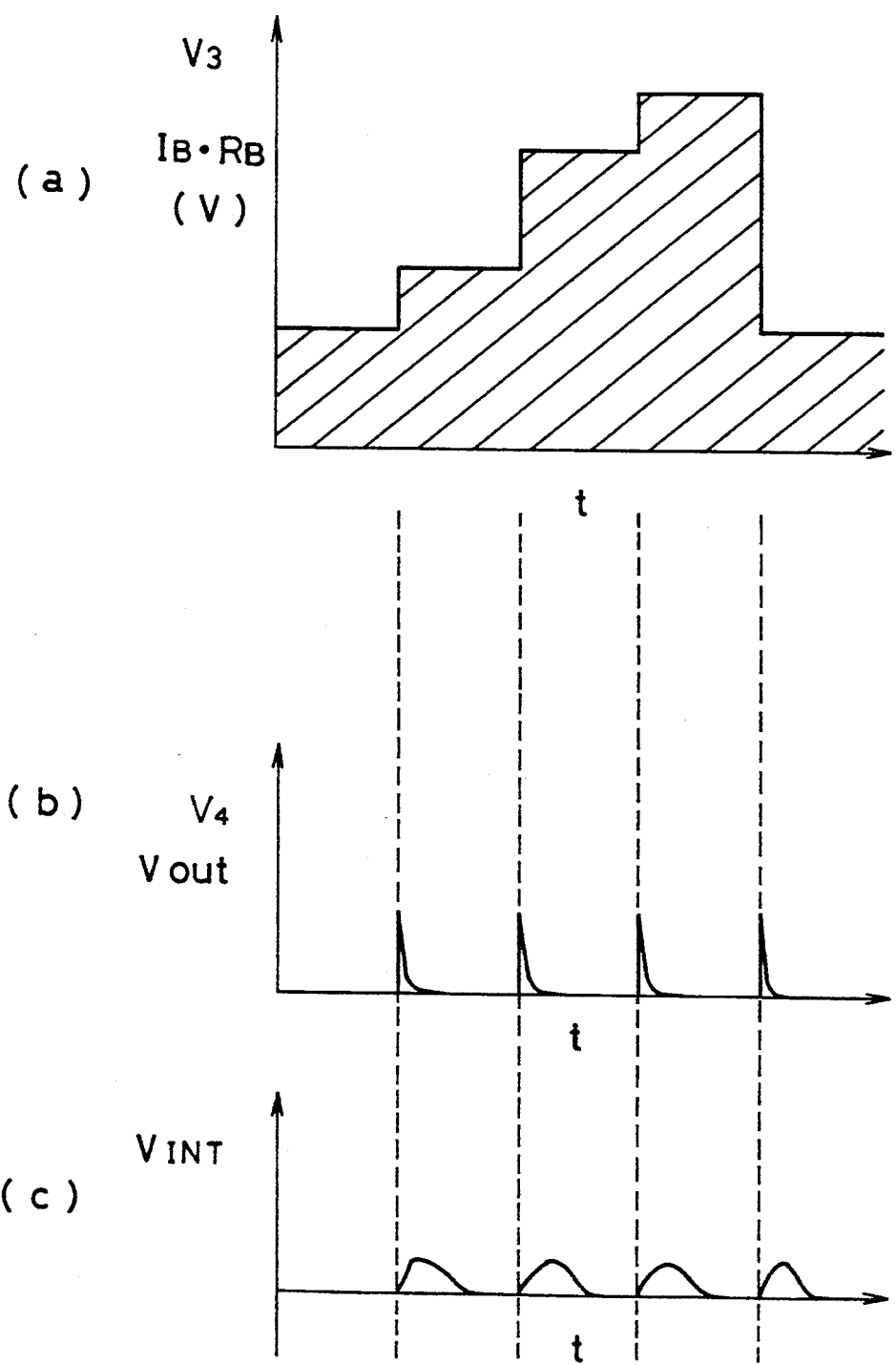

When such an electronic volume controller 100 is used in an audio circuit, the analog switch group 3 is comprised of elements each having a CMOS structure, namely, so-called transmission gates. FIG. 4(b) shows a symbolized transmission gate circuit with a symbolized switch SW (FIG. 4(a)). The switch SW in FIG. 4(a) is equivalent to each of the analog switch elements, $S_1$ to $S_n$ shown in FIG. 11. FIG. 5 depicts a control part of the transmission gate, and its internal equivalent circuit is shown in FIG. 6.

In general, several tens of the electronic volume controllers 100 each consisting of the transmission gate SW group 3 and the ladder resistance part 4 are connected in series in an identical semiconductor chip, and each of the switch elements arbitrarily turns ON/OFF, thereby each electronic volume controller 100 functions as a variable resistance. The switch group 3 is fabricated according to a system design where a digital signal control by a micro computer or the like allows the switch elements, $S_1$ to $S_n$, to operate. Specifically, the so-called up-down switches work like a manual type mechanical volume to sequentially raise or drop an attenuation level.

The biasing part Bi has resistance elements 13 and 14 and the electrolytic capacitor 24. The electrolytic capacitor 24 is not a component formed in the semiconductor chip including the signal processing IC but a discrete component which allows the flow of alternating current from a junction at $V_{cc}/2$ (node between the resistance elements 13 and 14) to ground the node.

The resistance elements 13 and 14 are provided between supply voltage $V_{cc}$ and the ground GND as voltage dividing resistances to produce d.c. bias voltage $V_{cc}/2$.

On the other hand, the output buffer B2 is comprised of an operational amplifying element 2 and a resistance element 12. The operational amplifying element 2 buffers an output signal $V_3$ (signal at a node $N_{31}$) from the electronic volume controller 100 to an output terminal $N_4$ without attenuation so that an output signal $V_4$ (signal at a node $N_4$) can be produced, not being affected by input impedance of a subsequent stage circuit connected to the output terminal $N_4$. Similarly, the d.c. bias voltage $V_{cc}/2$ is applied to a positive (+) input terminal of the operational amplifying element 2.

Figure 2:
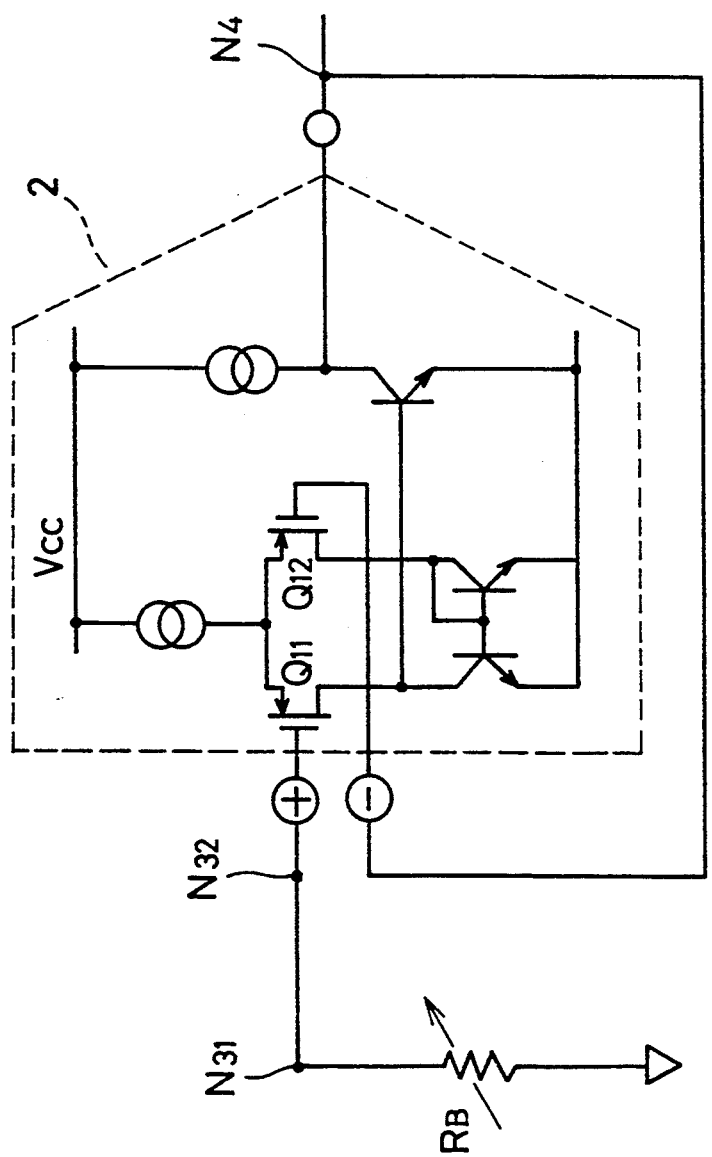
FIG. 2 depicts an electrical arrangement of an operational amplifying element of an output buffer.

FIG. 2 is a circuit diagram showing in detail a structure of the operational amplifying element 2. In FIG. 2, a resistance value at the ladder resistance part 4 is represented as a variable resistance $R_B$. An input part (differential circuit clement) of the operational amplifying element 2 is comprised of two P channel MOSFETs $Q_{11}$ and $Q_{12}$. Thus, in the operational amplifying clement 2, input bias current equivalent to base current $I_B$ caused in the prior art embodiment does not flow in the variable resistance $R_B$, and the voltage drop $I_B \cdot R_B$ never arises.

Figure 3:
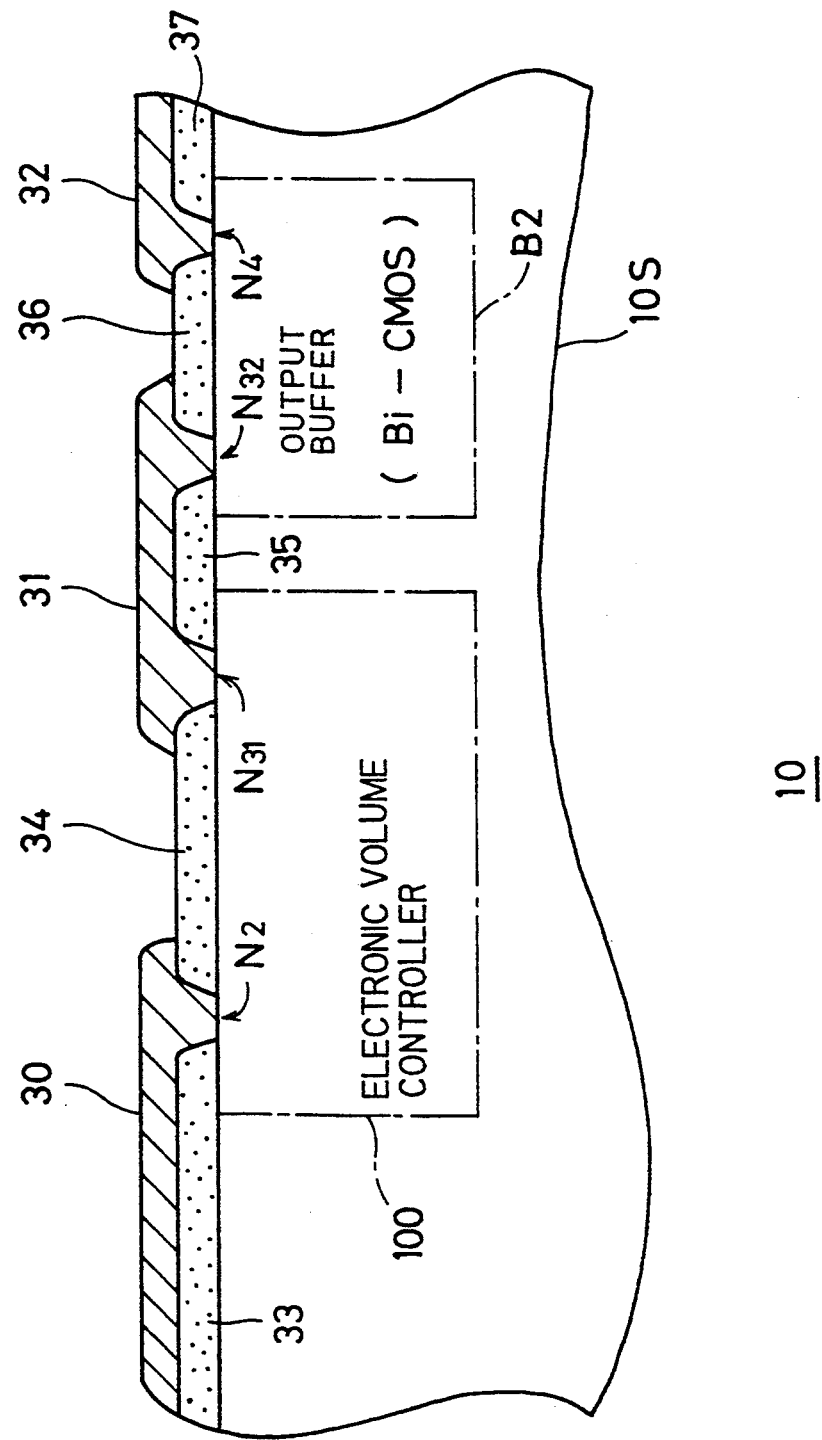
FIG. 3 is a schematic sectional view showing an internal structure of a signal processing IC.

FIG. 3 is a schematic sectional view showing an internal structure of the signal processing IC 10. As shown in FIG. 3, the electronic volume controller 100 and the output buffer B2 are formed in an identical semiconductor substrate 10S. The electronic volume controller 100, which is comprised of the ladder resistance part 4 and the CMOS analog switch group 3 as mentioned above, is fabricated by the CMOS technology. The output buffer B2 has a Bi-CMOS configuration, having its input part formed of a MOSFET and all the remaining part formed of a bipolar transistor. Thus, forming these elements, 100 and B2, in the identical substrate 10S is facilitated.

An output terminal (node $N_{31}$) of the electronic volume controller 100 and an input terminal (node $N_{32}$) of the input part of the output buffer B2 are directly connected by a wiring layer 31 (e.g., formed of Al film). Then, floating impedance appears between the elements, 100 and B2, may exhibit an extremely small value, compared with a case where those elements are formed of discrete components.

Wiring layers 30 and 32 are input and output wiring layers (e.g., formed of Al), respectively, and films 33 to 37 are insulating films (e.g., formed of $SiO_2$ film). The electronic volume controller 100 and the output buffer B2 are electrically isolated, in practice, by the LOCOS technology or the like though such an arrangement is omitted to simplify the drawing in FIG. 3. Moreover, the biasing element Bi is also omitted in FIG. 3 for the same reason.

Figure 7:
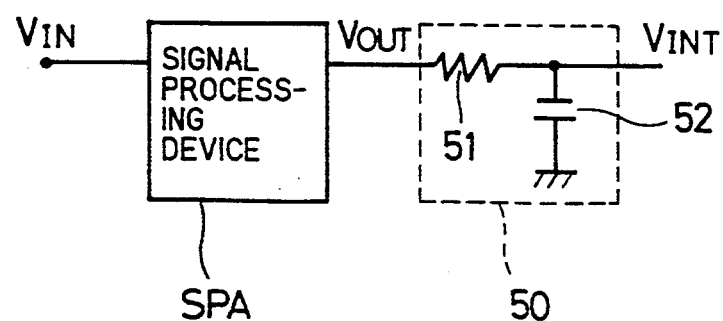
FIG. 7 depicts an electrical arrangement of an integrating circuit of the next stage circuit in the signal processing device.

In the signal processing device SPA as previously mentioned, no undesired voltage drop nor floating impedance is caused. Consequently, the generation of click noise can be prevented even if the signal processing device SPA is connected to a subsequent stage circuit (FIG. 7).

B. Embodiment 2

Figure 8:
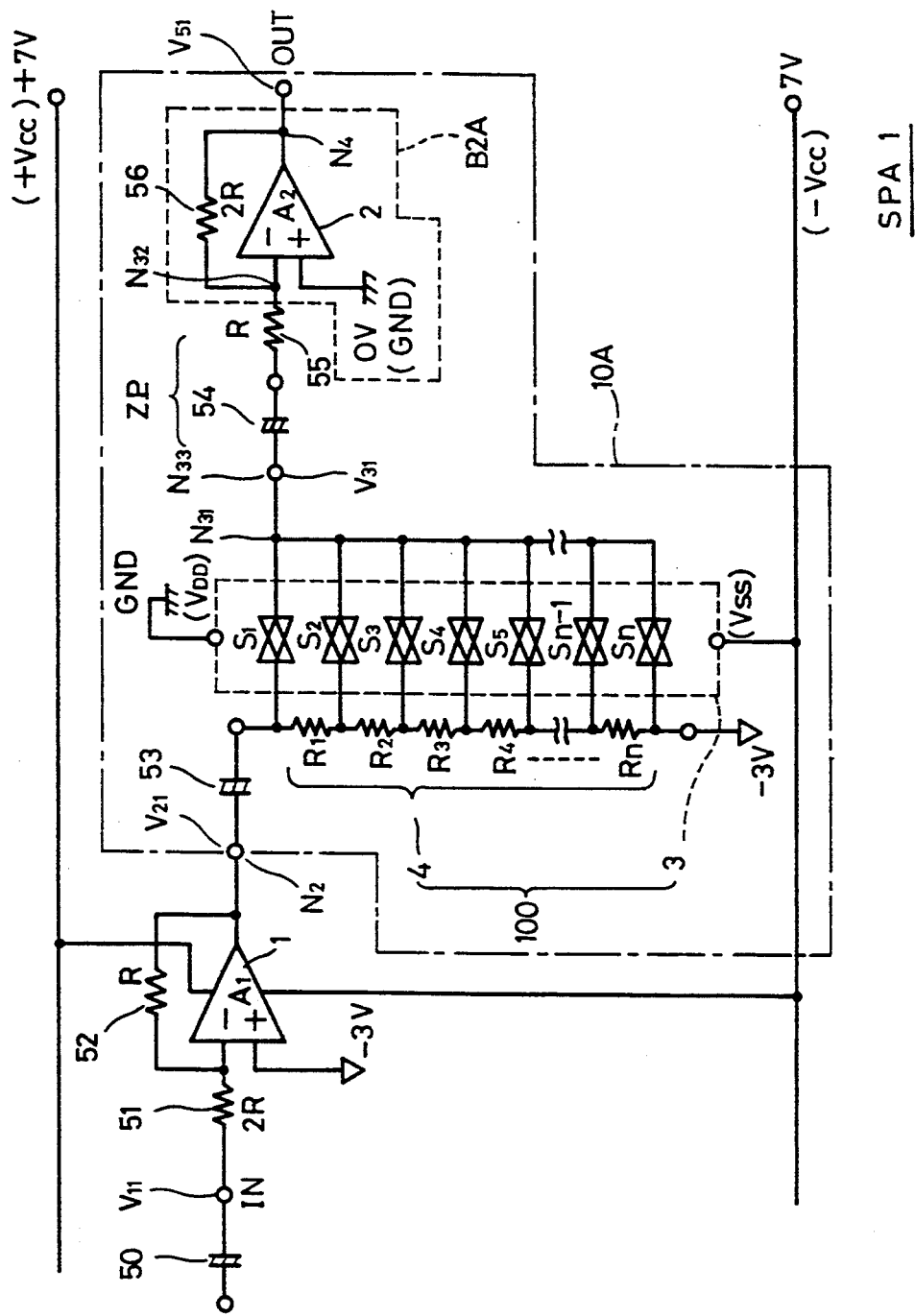
FIG. 8 depicts an electrical arrangement of another preferred embodiment according to the present invention.
Figure 9:
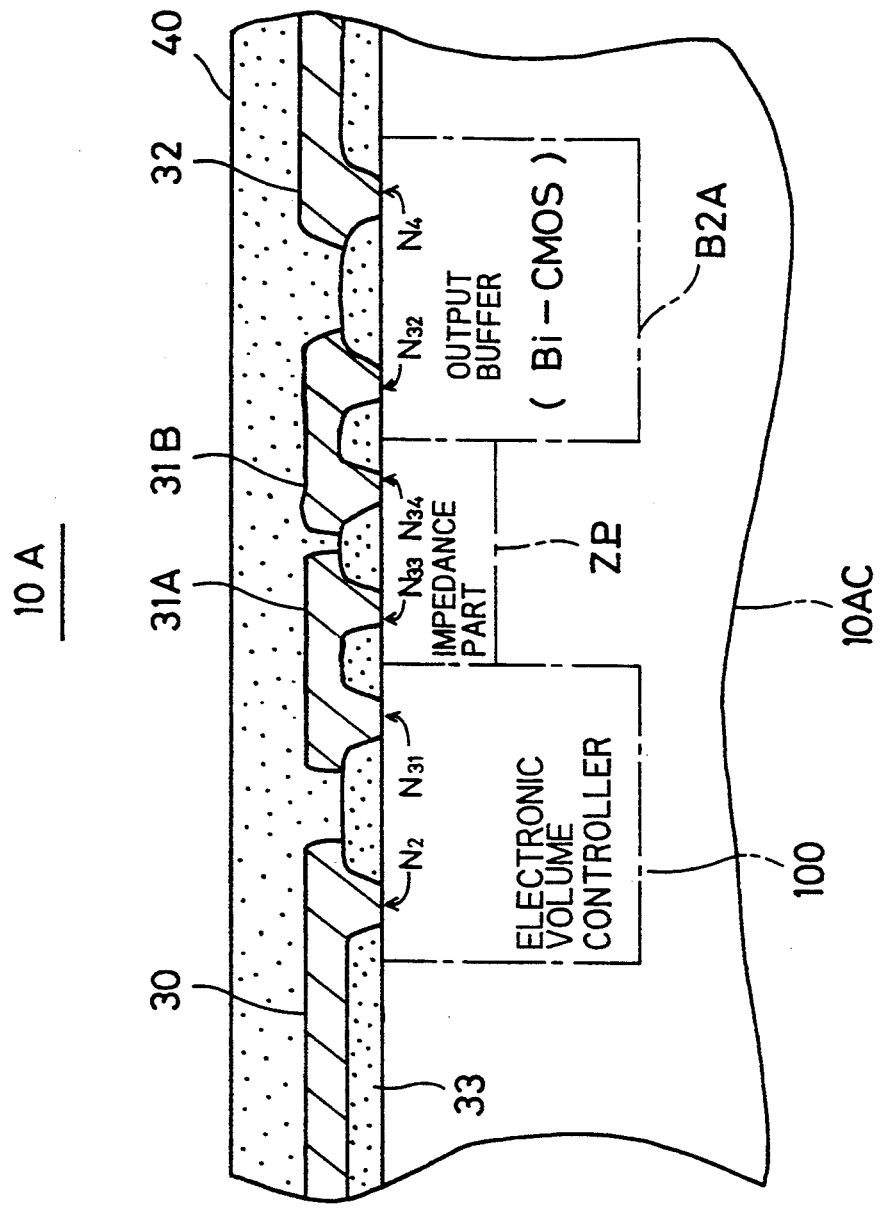
FIG. 9 is a sectional view showing an internal structure of the preferred embodiment according to the present invention.

FIG. 8 is a circuit diagram showing an electrical arrangement of a signal processing device SPA1 of another preferred embodiment according to the present invention. As can be seen, a main part of the signal processing device SPA1, namely, a signal processing IC 10A, includes an electronic volume controller 100, an impedance part ZP and an output buffer B2A. These elements (100, ZP and B2) are all formed in an identical semiconductor substrate, as shown in FIG. 9. An operational amplifying element 2 has a circuit configuration as shown in FIG. 2. Thus, the signal processing device SPA1 also has functions of preventing the flow of undesired input bias current and inhibiting the generation of floating impedance.

The signal processing device SPA1 is designed so as to process an audio signal of which level is over its sustainable voltage. An operation of the signal processing device SPA1 will be described in detail below.

Since an operational amplifier 1 together with resistances 51 and 52 constitutes a negative feedback circuit, its amplification degree is expressed as $-R/2R = -6$ dB, and a signal $V_{11}$ input to an input terminal IN is attenuated to $-6$ dB. Moreover, a level of a positive input terminal of the operational amplifier 1 is fixed at $-3$ V, and therefore, the center of an amplitude is shifted down to $-3$ V.

Figure 10:
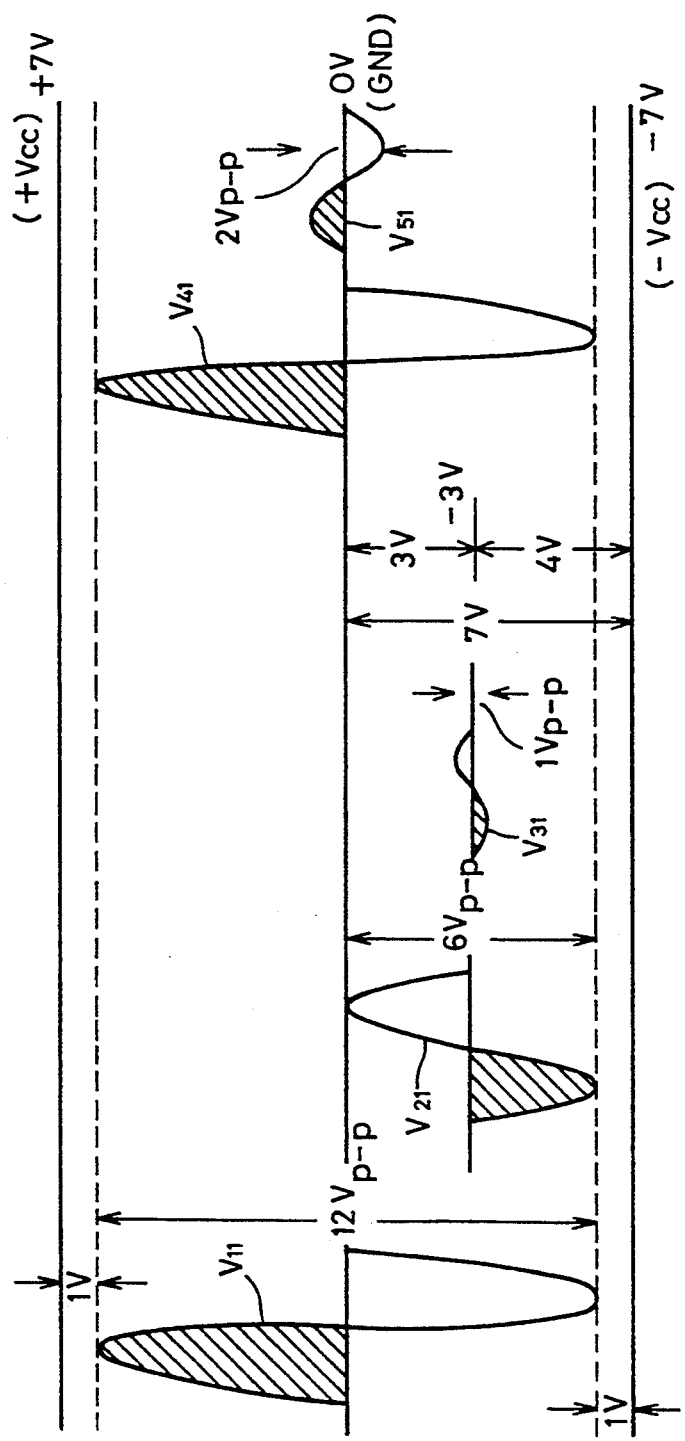
FIG. 10 is a waveform diagram of a sample signal.

When a signal of amplitude 12 $V_{p-p}$ is input via a coupling capacitor 50 to the input terminal IN, for example, obtained is the signal $V_{11}$ in which the center of its amplitude is 0 because d.c. component is cut off. The signal $V_{11}$ is attenuated by $-6$ dB and shifted down by $-3$ V by the operational amplifier 1 and the resistances 51 and 52, and then, a signal $V_{21}$ is produced having an amplitude of 6 $V_{p-p}$ and the center of its amplitude at $-3$ V. This is illustrated in FIG. 10. Shadowed portions in FIG. 10 correspond to each other; for example, a waveform of a positive half of the signal $V_{11}$ is inverted by the operational amplifier 1 and turned to a partial waveform of the signal $V_{21}$ at $-3$ V and below.

The disturbance of the signal $V_{21}$ obtained by the attenuation and shift-down always occurs at 0 V and below, and judging from reference level of $-V_{cc}(=-7$ V) lower than minimum value of the signal $V_{21}$, the disturbance varies in a range of 7 V. This is less than the level of sustainable voltage of an ordinary CMOS semiconductor structure, and hence, signals can be processed in this situation.

The signal $V_{21}$ is input to the electronic volume controller 100 via a capacitor element 53. Then, the analog switch group 3 controls voltage dividing by the ladder resistances part 4 to attenuate the signal $V_{21}$. This point has already been described.

Referring to a signal $V_{31}$ in FIG. 10, a manner of the attenuation of the signal $V_{21}$ is illustrated therein; for example, the signal $V_{21}$ is attenuated to 1/6 to produce the signal $V_{31}$ which has an amplitude of 1 $V_{p-p}$. However, since d.c. component of the signal $V_{21}$ is once cut off by the capacitor element 53, the lowermost resistance element $R_n$ must be fixed at a potential of $-3$ V to operate the electronic volume controller 100 always in a range of sustainable voltage (about 8 V) of the electronic volume controller 100 having an ordinary CMOS structure.

In the electronic volume controller 100, it is not necessarily required fixing the resistance element $R_n$ at the same potential as a positive input terminal of the operational amplifier 1; otherwise the signal $V_{21}$ may be input to the electronic volume controller 100 without change (without cutting off its d.c. component) by the capacitor element 53. In this case, however, the lowermost resistance element $R_n$ may be grounded via a capacitor element so that a potential at the electronic volume controller 100 may be determined.

Since the signal $V_{31}$ attenuated in the electronic volume controller 100 is subjected to a process of amplifying and shifting-up by the operational amplifying element 2 to compensate the attenuation and shift-down caused by the operational amplifier 1. Since the signal $V_{31}$ is input to a resistance element 55 via a capacitor element 54 where its d.c. component is cut off and furthermore the operational amplifying element 2 has its positive input terminal grounded, the signal $V_{31}$ is, as a whole, shifted up (i.e., its d.c. component is shifted up). Resistances elements 55 and 56 together constitute a negative feedback circuit, and its amplification degree is $|-2R/R| = 6dB$. An external circuit formed of the operational amplifier 1 and the resistances 51 and 52 and a circuit part formed of the operational amplifying element 2 and the resistances element 55 and 56 work complementarily to each other, so that only a voltage range in processing signals in the electronic volume controller 100 may be smaller than its sustainable voltage. Judging only from the input terminal IN and the output terminal OUT, the electronic volume controller 100 is deemed to be an electronic volume element having a high sustainable voltage and it can be treated as it were. This can be more specifically explained with reference to FIG. 10 as follows: If the signal $V_{21}$ is not attenuated by the electronic volume controller 100, the signal $V_{21}$ having an amplitude of 6 $V_{p-p}$ is amplified by 6 dB and its d.c. component is shifted up to 0 V, and eventually, a signal $V_{41}$ having an amplitude of 12 $V_{p-p}$ is obtained on the output terminal OUT. This means the same signal as the input signal $V_{11}$ is obtained, and the quantity of attenuation from the input terminal IN to the output terminal OUT equals the quantity of the attenuation caused by the electronic volume controller 100.

If the signal $V_{21}$ is attenuated to 1/6 by the electronic volume controller 100, the signal $V_{31}$ having an amplitude of 1 $V_{p-p}$ is amplified by 6 dB to have an amplitude of 2 $V_{p-p}$ and shift up its d.c. component to 0 V, and eventually, a signal $V_5$ is obtained on the output terminal OUT. Judging from the signal $V_{11}$ input to the input terminal IN, the resultant signal $V_5$ is deemed to be attenuated by 1/6, and the quantity of attenuation from the former to the latter is the same as that caused by the electronic volume controller 100.

C. Embodiment 3

In the previously mentioned Embodiment 1 and Embodiment 2, only the transistors $Q_{11}$ and $Q_{12}$ in the input part of the operational amplifier 2 are MOSFETs, but all transistor elements of the operational amplifying element 2 may be MOSFETs. In such a case, the electronic volume and the output buffer can be formed in an identical substrate by a CMOS process.

Besides, a semiconductor chip where the electronic volume and the output buffer are integrated as a unity by the Bi-FET process can be fabricated.

As has been described, in accordance with the present invention, variations of an output signal from an operational amplifier which causes noise can be prevented, and click noise generated while the electronic volume operates can be decreased.

Additionally, the signal processing device can process a signal larger in level than its sustainable voltage.

While the invention has been shown and described in detail, the foregoing description is in all aspects illustrative and not restrictive. It is therefore understood that numerous modifications and variations can be devised without departing from the scope of the invention.

We claim:

1. A signal processing device comprising:
    a semiconductor substrate;
    a first input portion formed on said semiconductor substrate for receiving an analog input signal;
    a second input portion formed on said semiconductor substrate for receiving a digital control signal;
    first circuit means formed within said semiconductor substrate and connected to said first input portion and said second input portion, for varying a level of said analog input signal as a function of said digital control signal to produce a varied analog signal at an output terminal of said first circuit means, wherein said first circuit means comprises a resistance network including a plurality of resistance elements connected in series, said resistance network being connected to said first input portion, and a switch group including a plurality of switch elements, each of said switch elements having a plurality of MOS transistors and turning on and off as a function of said digital control signal output from said second input portion, and having one end thereof connected to a node of said plurality of resistance elements and having another end thereof connected to said output terminal of said first circuit means; and
    second circuit means formed within said semiconductor substrate and connected to said output terminal of said first circuit means, for buffering said analog input signal, wherein said second circuit means comprises an operational amplifying element operating in accordance with a voltage level of said analog input signal, said operational amplifying element having a first input terminal thereof connected to said output terminal of said first circuit means through a conductive layer formed on said semiconductor substrate and a second input terminal thereof connected to an output terminal thereof, and further comprises a first MOS transistor having a gate thereof serving as said first input terminal and a second MOS transistor having a gate thereof serving as said second input terminal, said first and second MOS transistors together forming a differential amplifying element.

2. A signal processing device according to claim 1, wherein said operational amplifying element further comprises a bipolar transistor connected to an output terminal of said differential amplifying element and to said output terminal of said operational amplifying element.

3. A signal processing device according to claim 2, wherein said analog input signal has a frequency in the audio range.

4. A signal processing device according to claim 3, wherein said second circuit means further comprises an impedance element connected to said output terminal of said first circuit means, and buffer means connected to said impedance element.

5. A signal processing device according to claim 4, wherein said impedance element is connected to said output terminal of said first circuit means and to an input terminal of said buffer means via first and second conductive layers formed on said semiconductor substrate.

6. A signal processing device according to claim 5, wherein said impedance element includes a resistance element.

7. A signal processing device according to claim 6, wherein said impedance element further includes a capacitance element.

8. A signal processing device according to claim 7, further comprising third circuit means connected to an output terminal of said second circuit means for differentiating an analog signal output from said second circuit means.

9. A signal processing device according to claim 1, further comprising third circuit means connected to an output terminal of said second circuit means for differentiating an analog signal output from said second circuit means.

* * * * *

UNITED STATES PATENT AND TRADEMARK OFFICE
CERTIFICATE OF CORRECTION

PATENT NO. : 5,406,636
DATED : April 11, 1995
INVENTOR(S) : Yusuke YAMADA, et al.

It is certified that error appears in the above-indentified patent and that said Letters Patent is hereby corrected as shown below:

On the title page, Item [75], the first inventor's name should read:

--Yusuke Yamada--

Signed and Sealed this

Twentieth Day of June, 1995

Attest:

BRUCE LEHMAN

Attesting Officer

Commissioner of Patents and Trademarks